(12) United States Patent
Frank

(10) Patent No.: US 9,847,121 B2
(45) Date of Patent: Dec. 19, 2017

(54) PROVIDING CONTROLLED PULSES FOR QUANTUM COMPUTING

(71) Applicant: International Business Machines Corporation, Armonk, NY (US)

(72) Inventor: David J. Frank, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 14/852,614

(22) Filed: Sep. 13, 2015

(65) Prior Publication Data

US 2017/0076787 A1 Mar. 16, 2017

(51) Int. Cl.
*G11C 11/44* (2006.01)
*G06N 99/00* (2010.01)

(52) U.S. Cl.
CPC ............ *G11C 11/44* (2013.01); *G06N 99/002* (2013.01)

(58) Field of Classification Search
CPC ................................ H04L 41/50; G11C 11/44
USPC ......................................................... 375/285
See application file for complete search history.

(56) References Cited

U.S. PATENT DOCUMENTS

| 7,135,701 | B2 | 11/2006 | Amin et al. |
| 7,498,832 | B2 | 3/2009 | Baumgardner et al. |
| 7,876,145 | B2 | 1/2011 | Koch |
| 8,571,614 | B1 | 10/2013 | Mukhanov et al. |
| 2009/0015317 | A1 | 1/2009 | DiVincenzo et al. |
| 2009/0070402 | A1* | 3/2009 | Rose .................... G06N 99/002 709/201 |
| 2012/0157031 | A1* | 6/2012 | Strickland ............ H04B 1/1036 455/307 |
| 2016/0148112 | A1* | 5/2016 | Kwon .................. G06N 99/002 257/31 |

OTHER PUBLICATIONS

Yang, "Coherent Control of Hyperfine-coupled Electron and Nuclear Spins for Quantum Information Processing", MIT PhD Dissertation, Jun. 2008, pp. 1-87.
Ladd et al. "Quantum computers." Nature vol. 464, Mar. 2010: pp. 5-53.
Schoelkopf et al., "Wiring up quantum systems", Nature vol. 451, Feb. 2008: pp. 664-669.

(Continued)

*Primary Examiner* — Michael Neff
(74) *Attorney, Agent, or Firm* — L. Jeffrey Kelly

(57) ABSTRACT

A quantum mechanical radio frequency (RF) signaling system includes a transmission line that receives and conducts an RF pulse signal operating at a radio frequency, a first qubit having a quantum mechanical state that is a linear combination of at least two quantum mechanical eigenstates, and a first network of reactive electrical components having an input that is coupled to the transmission line for receiving the RF pulse signal and an output that is coupled to the first qubit. The first network of reactive electrical components attenuates the amplitude of the RF pulse signal and produces a first attenuated RF pulse signal that is applied to the first qubit. The first attenuated RF pulse signal operates at the radio frequency and has a first attenuated amplitude that causes a predefined change in the linear combination of at least two quantum mechanical eigenstates within the first qubit.

19 Claims, 8 Drawing Sheets

(56) References Cited

OTHER PUBLICATIONS

Morton et al. "Embracing the quantum limit in silicon computing." Nature vol. 479, Nov. 2011: pp. 345-353.
Wallquist, "Controllable coupling of superconducting qubits and implementation of quantum gate protocols." Chalmers University of Technology, 2006, pp. 1-91.
Hornibrook et al., "Cryogenic Control Architecture for Large-Scale Quantum Computing", Phys. Rev. Applied 3, 024010 (2015), arXiv:1409.2202v1 [cond-mat.mes-hall], submitted Sep. 8, 2014, 8 pages.
Koch et al., "Charge Insensitive Qubit Design Derived From the Cooper Pair Box", Phys. Rev. A 76, 042319 (2007), arXiv:cond-mat/0703002v2 [cond-mat.mes-hall], submitted Feb. 28, 2007, 21 pages.

\* cited by examiner

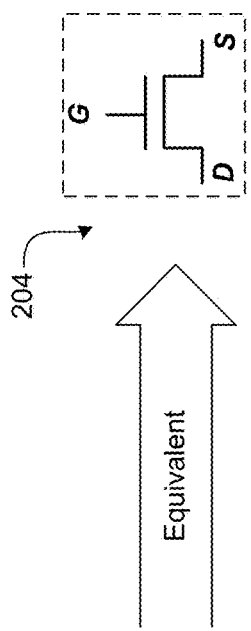
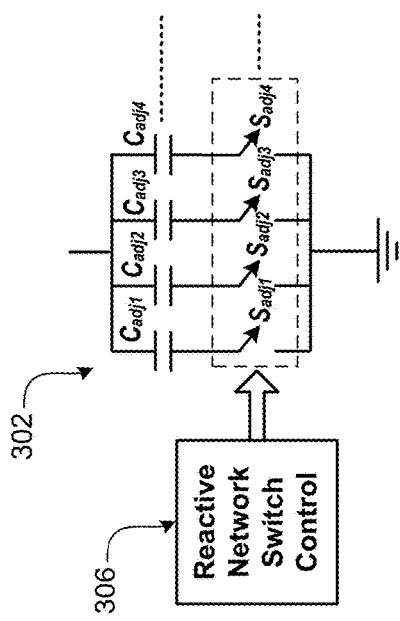
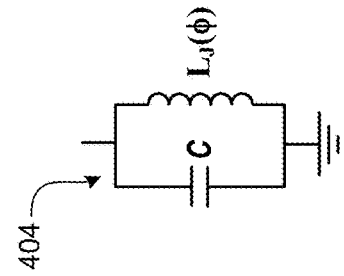
FIG. 2
FIG. 3
FIG. 4

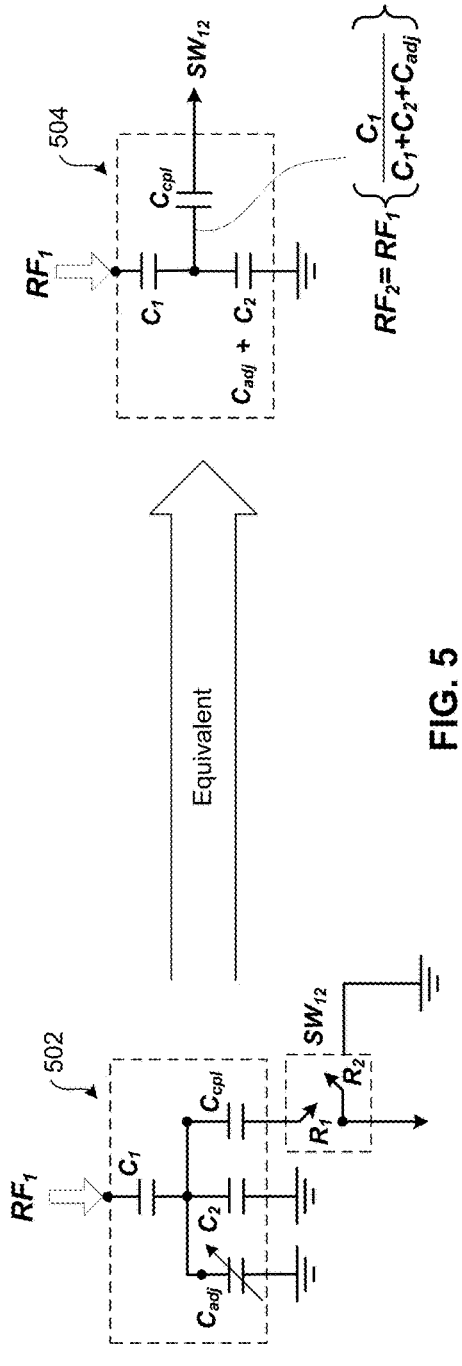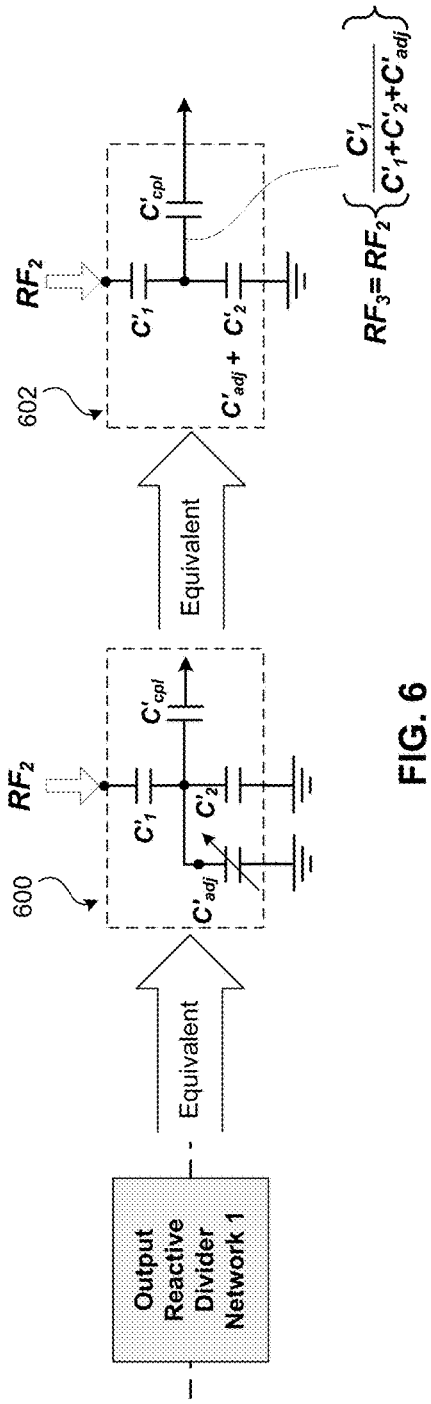
FIG. 5
FIG. 6

PROVIDING CONTROLLED PULSES FOR QUANTUM COMPUTING

STATEMENT REGARDING FEDERALLY SPONSORED RESEARCH OR DEVELOPMENT

This invention was made with Government support under H98230-13-C-0220 awarded by the Department of Defense. The Government has certain rights to this invention.

BACKGROUND

The present invention generally relates to quantum computing, and more particularly, to controlling the provision of pulses within quantum computing systems.

Quantum computing has emerged based on its applications in, for example, cryptography and computational speedup. At the heart of a quantum computer lies the utilization of qubits (i.e., quantum bits), whereby a qubit may, among other things, be considered the analogue of a classical bit (i.e., digital bit—'0' or '1') having two quantum mechanical states (e.g., a high state and a low state) such as the spin states of an electron (i.e., '1'=↑ and '0'=↓), the polarization states of a photon (i.e., '1'=H and '0'=V), or the ground state ('0') and first excited state ('1') of a transmon, which is a superconducting resonator made from a capacitor in parallel with a Josephson junction acting as a non-linear inductor. Although qubits are capable of storing classical '1' and '0' information, they also present the possibility of storing information as a superposition of '1' and '0' states.

To construct a large scale quantum computer having, for example, millions of physical qubits, a hierarchical approach that minimizes complexity and signal wiring may be desirable. More specifically, increased complexity and signal wiring contributes to increased heat dissipation within the cryogenically controlled environment used to operate a quantum computer. This increase in heat dissipation may in turn undesirably cause changes in the quantum mechanical states of the qubits, or it may introduce difficulties in maintaining the desired cryogenic operating temperature.

BRIEF SUMMARY

According to one embodiment, a quantum mechanical radio frequency (RF) signaling system includes a transmission line that receives and conducts an RF pulse signal operating at a radio frequency, a first qubit having a quantum mechanical state that is a linear combination of at least two quantum mechanical eigenstates, and a first network of reactive electrical components having an input coupled to the transmission line for receiving the RF pulse signal and an output coupled to the first qubit. The first network of reactive electrical components attenuates the amplitude of the RF pulse signal and produces a first attenuated RF pulse signal that is applied to the first qubit. The first attenuated RF pulse signal operates at the radio frequency and has a first attenuated amplitude that causes a predefined change in the linear combination of at least two quantum mechanical eigenstates within the first qubit. The first network of reactive electrical components include an adjustable reactance for varying an attenuation associated with the first attenuated amplitude.

According to another exemplary embodiment, a computer system for providing radio frequency (RF) signalling over a transmission line to a plurality of qubits coupled to the transmission line in a quantum mechanical computer system is provided. The computer system includes one or more processors, one or more computer-readable memories, one or more computer-readable tangible storage devices, and program instructions stored on at least one of the one or more storage devices for execution by at least one of the one or more processors via at least one of the one or more memories. The computer system is capable of performing a method including applying an RF pulse signal operating at a radio frequency to the transmission line and attenuating, using a first network of reactive electrical components, the amplitude of the applied RF pulse signal received from the transmission line to generate a first attenuated RF pulse signal operating at the radio frequency and having a first attenuated amplitude. Using a second network of reactive electrical components, the amplitude of the applied RF pulse signal received from the transmission line is attenuated to generate a second attenuated RF pulse signal operating at the radio frequency and having a second attenuated amplitude. The first attenuated RF pulse signal is applied to the first qubit and causes, based on the first attenuated amplitude, a predefined change in a linear combination of at least two quantum mechanical eigenstates within the first qubit. The second attenuated RF pulse signal is applied to the second qubit and causes, based on the second attenuated amplitude, the predefined change in the linear combination of at least two quantum mechanical eigenstates within the second qubit. The first attenuated signal and the second attenuated signal compensate for differences in reactive component tolerances between the first network of reactive electrical components and the second network of reactive electrical components.

According to yet another exemplary embodiment, a quantum mechanical radio frequency (RF) signalling system includes a first qubit having a first input, a second qubit having a second input, and a reactive element coupled between the first input of the first qubit and the second input of the second qubit. A first transmission line receives and conducts a first RF pulse signal having a first radio frequency and a second transmission line receives and conducts a second RF pulse signal having a second radio frequency. A first network of reactive electrical components includes an input coupled to the first transmission line for receiving the first RF pulse signal and an output coupled to the first qubit, whereby the first network of reactive electrical components attenuates the amplitude of the first RF pulse signal and produces a first attenuated RF pulse signal that is applied to the first qubit. The first attenuated RF pulse signal operates at the first radio frequency and has a first attenuated amplitude that causes a predefined change in a linear combination of at least two quantum mechanical eigenstates within the first qubit. A second network of reactive electrical components has an input coupled to the second transmission line for receiving the second RF pulse signal and an output coupled to the first qubit, whereby the second network of reactive electrical components attenuates the amplitude of the second RF pulse signal and produces a second attenuated RF pulse signal that is applied to the first qubit and coupled to the second qubit via the coupling element. The second attenuated RF pulse signal operates at the second radio frequency and has a second attenuated amplitude that causes a quantum mechanical entanglement between the first qubit and the second qubit.

BRIEF DESCRIPTION OF THE SEVERAL VIEWS OF THE DRAWINGS

FIG. 2 shows an exemplary equivalent circuit representation of a switch used in the quantum mechanical computer radio frequency (RF) signaling system depicted in FIG. 1 and FIG. 8, according to one embodiment;

FIG. 3 shows an exemplary equivalent circuit representation of an adjustable reactive component used in the quantum mechanical computer radio frequency (RF) signaling system depicted in FIG. 1 and FIG. 8, according to one embodiment;

FIG. 4 shows an exemplary equivalent circuit representation of a qubit used in the quantum mechanical computer radio frequency (RF) signaling system depicted in FIG. 1 and FIG. 8, according to one embodiment;

FIG. 5 shows an exemplary equivalent circuit representation of a network of reactive electrical components used in the quantum mechanical computer radio frequency (RF) signaling system depicted in FIG. 1 and FIG. 8, according to one embodiment;

FIG. 6 shows an exemplary equivalent circuit representation of an output-stage network of reactive electrical components used in the quantum mechanical computer radio frequency (RF) signaling system depicted in FIG. 1 and FIG. 8, according to one embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The one or more exemplary embodiments described herein are directed to, among other things, a system and method of providing RF control pulses to a plurality of qubits by transmitting the RF control pulses along a single transmission line. The RF control pulses transmitted along the transmission line are tapped off the transmission line to distribute the RF pulses to the plurality of qubits in a manner that compensates for variations in qubit state change in response to receiving the RF control pulses. For example, such variations in qubit state change may be attributed to the reactive component tolerances associated with respective networks of reactive components that are used to attenuate the RF pulses received by each of the plurality of qubits. Other embodiments selectively provide quantum entanglement between adjacent qubits.

Figure 1:
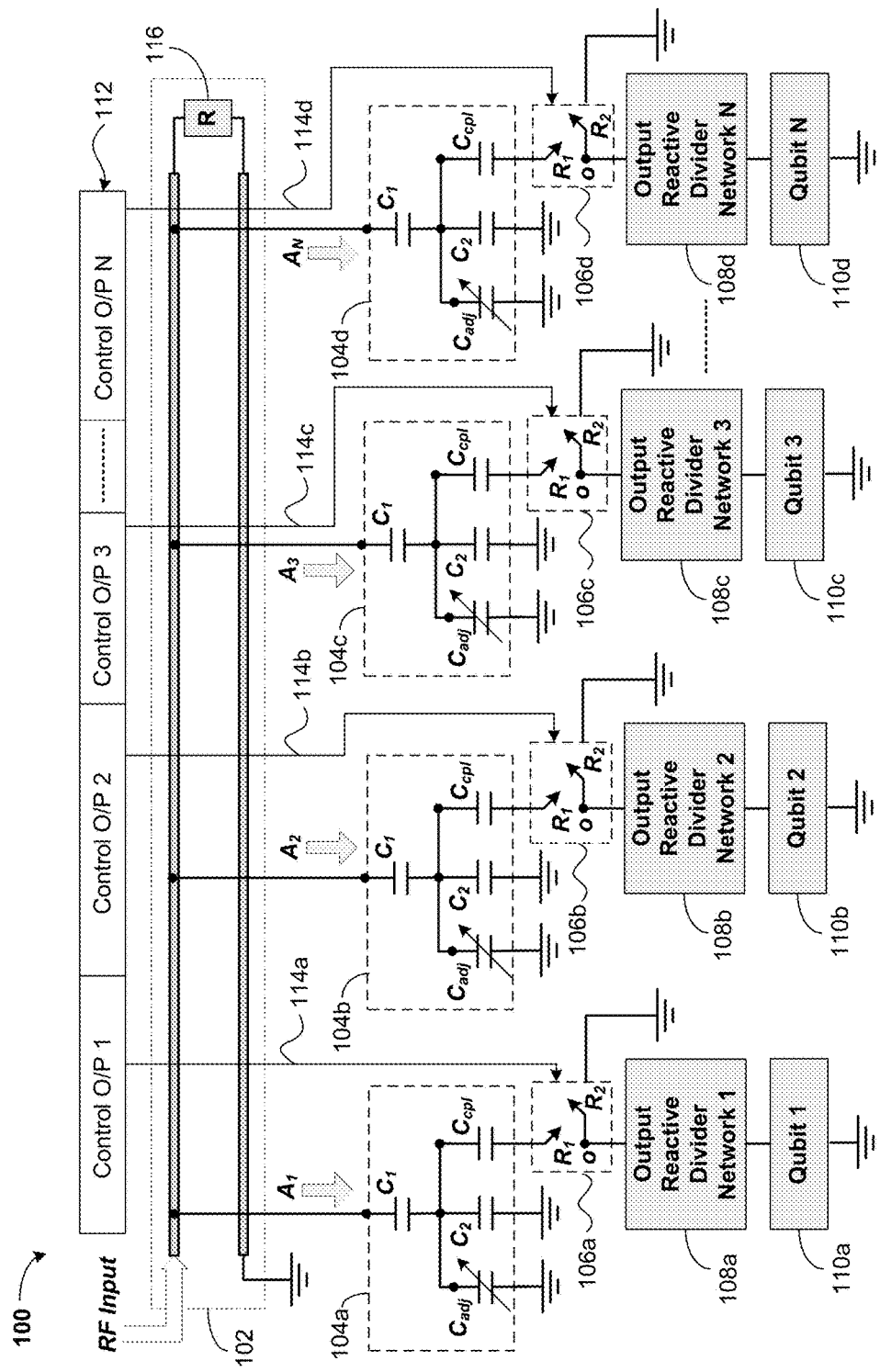
FIG. 1 shows an exemplary quantum mechanical computer radio frequency (RF) signaling system, according to one embodiment.

FIG. 1 shows an exemplary embodiment of a quantum mechanical computer radio frequency (RF) signaling system 100. The quantum mechanical computer radio frequency (RF) signaling system 100 may include a transmission line 102, a plurality of networks of reactive electrical components 104a-104d coupled to the transmission line 102, a plurality of switch units 106a-106d respectively coupled to the plurality of networks of reactive electrical components 104a-104d, a plurality of output-stage networks of reactive electrical components 108a-108d respectively coupled to the plurality of switch units 106a-106d, and a plurality of substantially identical qubits 110a-110d respectively coupled to the output-stage networks of reactive electrical components 108a-108d. The quantum mechanical computer radio frequency (RF) signaling system 100 may also include a control logic unit 112 having respective control outputs 114a-114d for controlling the actuation of the switches within switch units 106a-106d. The control logic unit 112 may be implemented in hardware, firmware, software, or any combination thereof. For illustrative brevity only four (4) qubits 110a-110d are depicted in FIG. 1. It may, however, be appreciated that any number of qubits (i.e., 1-N) can be coupled to the transmission line 102 via corresponding networks of reactive electrical components and controllable switch units.

The quantum mechanical computer radio frequency (RF) signaling system 100 may be maintained at cryogenic temperatures below one hundred (100) millikelvins (mK) in order to maintain the signaling system 100 at superconducting temperatures. For example, the quantum mechanical computer radio frequency (RF) signaling system 100 may be cooled in a cryostat to a temperature of about 30 mK.

Figure 7:
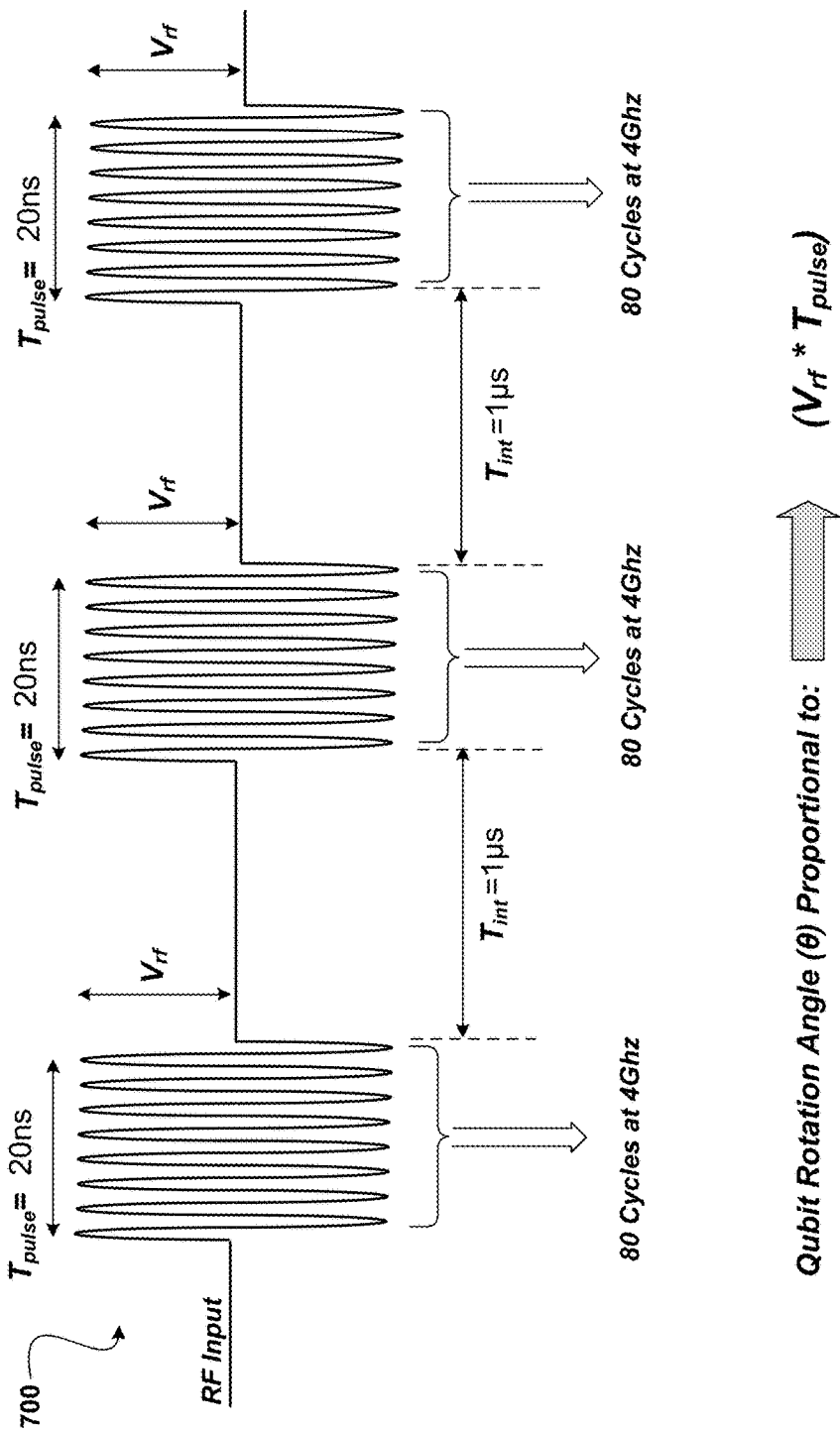
FIG. 7 shows an exemplary RF pulse signal used to drive the quantum mechanical computer radio frequency (RF) signaling system depicted in FIG. 1 and FIG. 8, according to one embodiment.

In operation, a radio frequency (RF) pulse signal is applied to the transmission line 102. The transmission line 102 is terminated by an impedance matching resistor 116 in order to mitigate RF signal reflections associated with the radio frequency (RF) pulse signal propagating along the transmission line 102. Referring to FIG. 7, an example of a radio frequency (RF) pulse signal 700 that is applied to the transmission line 102 (FIG. 1) is depicted, whereby a 4 Ghz RF signal is generated over a 20 nanosecond (ns) pulse period ($T_{pulse}$) at 1 microsecond (µs) intervals ($T_{int}$). Alternatively, according to other non-limiting examples, the radio frequency (RF) pulse signal 700 may include a RF signal in the range of about 1-10 Ghz that is generated over a pulse period ($T_{pulse}$) of about 10-500 ns at intervals ($T_{int}$) in the order of microseconds (µs), milliseconds (ms) or seconds (s).

Referring back to FIG. 1, the radio frequency (RF) pulse signal 700 (FIG. 7) may be tapped off the transmission line 102 and propagate in the direction of arrow $A_1$. As depicted, the radio frequency (RF) pulse signal 700 propagates in the direction of arrow $A_1$ and is input to the network of reactive electrical components 104a. The network of reactive electrical components 104a attenuates the amplitude of the radio frequency (RF) pulse signal 700 by a factor of about 10-100.

The attenuated radio frequency (RF) pulse signal 700 may then be received by switch unit 106a, whereby depending on the configuration of switches $R_1$ and $R_2$, qubit 110a undergoes either a predefined change in the linear combination of at least two quantum mechanical eigenstates, or maintains its current quantum mechanical eigenstate. Specifically, using control output 114a, if switch $R_1$ of unit 106a is actuated to a closed position while switch $R_2$ of unit 106a is actuated to an open position, the attenuated radio frequency (RF) pulse signal 700 passes through switch $R_1$ and is applied to qubit 110a. By selecting the frequency of the attenuated radio frequency (RF) pulse signal 700 to substantially match the resonance of the qubit 110a, the qubit 110a undergoes a predetermined rotation based on the amplitude of the attenuated radio frequency (RF) pulse signal 700.

In some implementations, the output-stage network of reactive electrical components 108a may be optionally omitted such that the attenuated radio frequency (RF) pulse signal 700 (FIG. 7) passes through switch $R_1$ to qubit 110a. In other implementations, the output-stage network of reactive electrical components 108a may be included such that the attenuated radio frequency (RF) pulse signal 700 passes through switch $R_1$ to qubit 110a via the output-stage network of reactive electrical components 108a. As depicted in FIG. 6, the output-stage network of reactive electrical components 600 may be substantially identical to that of the network of reactive electrical components 104a. However, in some implementations, the output-stage network of reactive electrical components 600 may be different to that of the network of reactive electrical components 104a. Moreover, each of the output-stage network of reactive electrical components 600 and the network of reactive electrical components 104a may include a mix of different reactive components (e.g., capacitors and inductors). The output-stage network of reactive electrical components 600 further attenuates the radio frequency (RF) pulse signal 700 that passes through switch $R_1$ to qubit 110a. Additionally, the reactive components of the output-stage network of reactive electrical components 600 isolate the qubit 110a from the resistive characteristics of switches $R_1$ and $R_2$ within switch unit 106a. The resistive nature of switches $R_1$ and $R_2$ (e.g., Field Effect Transistor switches: FET switches) may accordingly cause the qubit 110a to gradually loose its quantum eigenstate in the absence of such isolation.

Alternatively, as shown in FIG. 1, using control output 114a, if switch $R_1$ of unit 106a is actuated to an open position while switch $R_2$ of unit 106a is actuated to a closed position, the qubit 110a maintains its current eigenstate on the basis that it is isolated from the attenuated radio frequency (RF) pulse signal 700 (FIG. 7) received from the network of reactive electrical components 104a. By closing switch $R_2$, the output terminal "o" of switch $R_1$ is electrically coupled to ground via switch $R_2$. Thus, any electrical leakage current across open-circuit switch $R_1$ (e.g., FET switch) may accordingly be diverted to ground via switch $R_2$. By diverting this leakage current, potential quantum state changes associated with the qubit 110a may be avoided. Thus, the qubit 110a experiences longer coherence times.

As further shown in FIG. 1, the radio frequency (RF) pulse signal 700 (FIG. 7) may be tapped off the transmission line 102 and also propagate in the direction of arrow $A_2$. As depicted, the radio frequency (RF) pulse signal 700 propagates in the direction of arrow $A_2$ and is input to the network of reactive electrical components 104b. The network of reactive electrical components 104b accordingly attenuates the amplitude of the radio frequency (RF) pulse signal 700 by a factor of about 10-100. The attenuated radio frequency (RF) pulse signal 700 (FIG. 7) may then be received by switch unit 106b, whereby depending on the configuration of switches $R_1$ and $R_2$, qubit 110b undergoes either a predefined change in the linear combination of at least two quantum mechanical eigenstates, or maintains its current quantum mechanical eigenstate. Specifically, using control output 114b, if switch $R_1$ of unit 106b is actuated to a closed position while switch $R_2$ of unit 106b is actuated to an open position, the attenuated radio frequency (RF) pulse signal 700 passes through switch $R_1$ and is applied to qubit 110b. Since the frequency of the attenuated radio frequency (RF) pulse signal 700 substantially matches the resonance of qubit 110b, as with qubit 110a, this qubit 110b also undergoes the predetermined rotation based on the amplitude of the attenuated radio frequency (RF) pulse signal 700.

In some implementations, the output-stage network of reactive electrical components 108b may be optionally omitted such that the attenuated radio frequency (RF) pulse signal 700 (FIG. 7) passes through switch $R_1$ to qubit 110b. In other implementations, the output-stage network of reactive electrical components 108b may be included such that the attenuated radio frequency (RF) pulse signal 700 passes through switch $R_1$ to qubit 110b via the output-stage network of reactive electrical components 108b. As depicted in FIG. 6, output-stage network of reactive electrical components 600 may be substantially identical to that of the network of reactive electrical components 104b. As such the output-stage network of reactive electrical components 600 further attenuates the radio frequency (RF) pulse signal 700 that passes through switch $R_1$ to qubit 110b. Additionally, the reactive components of the output-stage network of reactive electrical components 600 isolate the qubit 110b from the resistive characteristics of switches $R_1$ and $R_2$ within switch unit 106b. The resistive nature of switches $R_1$ and $R_2$ (e.g., Field Effect Transistor switches: FET switches) may accordingly cause the qubit 110b to gradually loose its quantum eigenstate in the absence of such isolation.

Alternatively, using control output 114b, if switch $R_1$ of unit 106b is actuated to an open position while switch $R_2$ of unit 106b is actuated to a closed position, the qubit 110b maintains its current eigenstate on the basis that it is isolated from the attenuated radio frequency (RF) pulse signal 700 (FIG. 7) received from the network of reactive electrical components 104b. By closing switch $R_2$ of switch unit 106b, the output terminal "o" of switch $R_1$ is electrically coupled to ground via switch $R_2$. Thus, any electrical leakage current across the open-circuit switch $R_1$ (e.g., FET switch) of switch unit 106b may accordingly be diverted to ground via switch $R_2$. By diverting this leakage current, potential quantum state changes associated with the qubit 110b may be avoided. Thus, the qubit 110b experiences longer coherence times.

Still referring to FIG. 1, the radio frequency (RF) pulse signal 700 (FIG. 7) may be tapped off the transmission line 102 and further propagate in the direction of arrow $A_3$. As depicted, the radio frequency (RF) pulse signal 700 propagates in the direction of arrow $A_3$ and is input to the network of reactive electrical components 104c. The network of reactive electrical components 104c accordingly attenuates the amplitude of the radio frequency (RF) pulse signal 700 by a factor of about 10-100. The attenuated radio frequency (RF) pulse signal 700 (FIG. 7) may then be received by switch unit 106c, whereby depending on the configuration of switches $R_1$ and $R_2$, qubit 110c undergoes either a predefined change in the linear combination of at least two quantum mechanical eigenstates, or maintains its current quantum mechanical eigenstate. Specifically, using control output 114c, if switch $R_1$ of unit 106c is actuated to a closed position while switch $R_2$ of unit 106c is actuated to an open position, the attenuated radio frequency (RF) pulse signal 700 passes through switch $R_1$ and is applied to qubit 110c. Since the frequency of the attenuated radio frequency (RF) pulse signal 700 substantially matches the resonance of qubit 110c, as with qubits 110a-110b, this qubit 110c also undergoes the predetermined rotation based on the amplitude of the attenuated radio frequency (RF) pulse signal 700.

In some implementations, the output-stage network of reactive electrical components 108c may be optionally omitted such that the attenuated radio frequency (RF) pulse signal 700 (FIG. 7) passes through switch $R_1$ to qubit 110c. In other implementations, the output-stage network of reactive electrical components 108c may be included such that the attenuated radio frequency (RF) pulse signal 700 passes through switch $R_1$ to qubit 110c via the output-stage network of reactive electrical components 108b. As depicted in FIG. 6, output-stage network of reactive electrical components 600 may be substantially identical to that of the output-stage network of reactive electrical components 104c. As such the output-stage network of reactive electrical components 600 further attenuates the radio frequency (RF) pulse signal 700 that passes through switch $R_1$ to qubit 110c. Additionally, the reactive components of the output-stage network of reactive electrical components 600 isolate the qubit 110c from the resistive characteristics of switches $R_1$ and $R_2$ within switch unit 106c. The resistive nature of switches $R_1$ and $R_2$ (e.g., Field Effect Transistor switches: FET switches) may accordingly cause the qubit 110c to gradually loose its quantum eigenstate in the absence of such isolation.

Alternatively, using control output 114c, if switch $R_1$ of unit 106c is actuated to an open position while switch $R_2$ of unit 106c is actuated to a closed position, the qubit 110c maintains its current eigenstate on the basis that it is isolated from the attenuated radio frequency (RF) pulse signal 700 (FIG. 7) received from the network of reactive electrical components 104c. By closing switch $R_2$ of switch unit 106c, the output terminal "o" of switch $R_1$ is electrically coupled to ground via switch $R_2$. Thus, any electrical leakage current across the open-circuit switch $R_1$ (e.g., FET switch) of switch unit 106c may accordingly be diverted to ground via switch $R_2$. By diverting this leakage current, potential quantum state changes associated with the qubit 110c may be avoided. Thus, the qubit 110c experiences longer coherence times.

Still referring to FIG. 1, the radio frequency (RF) pulse signal 700 (FIG. 7) may be tapped off the transmission line 102 and further propagate in the direction of arrow $A_4$. As depicted, the radio frequency (RF) pulse signal 700 also propagates in the direction of arrow $A_4$ and is accordingly input to the network of reactive electrical components 104d. The network of reactive electrical components 104d thus attenuates the amplitude of the radio frequency (RF) pulse signal 700 by a factor of about 10-100. The attenuated radio frequency (RF) pulse signal 700 may then be received by switch unit 106d, whereby depending on the configuration of switches $R_1$ and $R_2$, qubit 110d undergoes either a predefined change in the linear combination of at least two quantum mechanical eigenstates, or maintains its current quantum mechanical eigenstate. Specifically, using control output 114d, if switch $R_1$ of unit 106d is actuated to a closed position while switch $R_2$ of unit 106d is actuated to an open position, the attenuated radio frequency (RF) pulse signal 700 (FIG. 7) passes through switch $R_1$ and is applied to qubit 110d. Since the frequency of the attenuated radio frequency (RF) pulse signal 700 substantially matches the resonance of qubit 110d, as with qubits 110a-110c, this qubit 110d also undergoes the predetermined rotation based on the amplitude of the attenuated radio frequency (RF) pulse signal 700.

In some implementations, the output-stage network of reactive electrical components 108d may be optionally omitted such that the attenuated radio frequency (RF) pulse signal 700 (FIG. 7) passes through switch $R_1$ to qubit 110d. In other implementations, the output-stage network of reactive electrical components 108d may be included such that the attenuated radio frequency (RF) pulse signal 700 passes through switch $R_1$ to qubit 110d via the output-stage network of reactive electrical components 108d. As depicted in FIG. 6, output-stage network of reactive electrical components 600 may be substantially identical to that of the network of reactive electrical components 104d. As such the output-stage network of reactive electrical components 600 further attenuates the radio frequency (RF) pulse signal 700 that passes through switch $R_1$ to qubit 110d. Additionally, the reactive components of the output-stage network of reactive electrical components 600 isolate the qubit 110d from the resistive characteristics of switches $R_1$ and $R_2$ within switch unit 106d. The resistive nature of switches $R_1$ and $R_2$ (e.g., Field Effect Transistor switches: FET switches) may accordingly cause the qubit 110d to gradually loose its quantum eigenstate in the absence of such isolation.

Alternatively, using control output 114d, if switch $R_1$ of unit 106d is actuated to an open position while switch $R_2$ of unit 106d is actuated to a closed position, the qubit 110d maintains its current eigenstate on the basis that it is isolated from the attenuated radio frequency (RF) pulse signal 700 (FIG. 7) received from the network of reactive electrical components 104d. By closing switch $R_2$ of switch unit 106d, the output terminal "o" of switch $R_1$ is electrically coupled to ground via switch $R_2$. Thus, any electrical leakage current across the open-circuit switch $R_1$ (e.g., FET switch) of switch unit 106d may accordingly be diverted to ground via switch $R_2$. By diverting this leakage current, potential quantum state changes associated with the qubit 110d may be avoided. Thus, the qubit 110d experiences longer coherence times.

The attenuation of the radio frequency (RF) pulse signal 700 (FIG. 7) by the networks of reactive electrical components 104a-104d allows individual signal amplitude adjustment and mitigates interactions between the qubits 110a-110d. Referring to FIG. 5, an exemplary network of reactive electrical components 502 that may be used for networks 104a-104d (FIG. 1) is depicted. The network of reactive electrical components 502 may be described by its equivalent circuit 504. As shown, an input RF pulse signal (i.e., $RF_1$) is attenuated by the divider network of capacitors (i.e., reactive components) to provide an output attenuated RF pulse signal (i.e., $RF_2$). In particular, the relationship between the input RF pulse signal (i.e., $RF_1$) and the output attenuated RF pulse signal (i.e., $RF_2$) is given by:

$$RF_2 = RF_1 \left( \frac{C_1}{C_1 + C_2 + C_{adj}} \right) \quad \text{Equation 1}$$

Whereby $C_1$ is an input capacitive reactive component having an input terminal coupled to the transmission line 102 (FIG. 1) and an output terminal coupled to parallel capacitive reactive components $C_{adj}$ and $C_2$. Thus, the input capacitive reactive component $C_1$ and the parallel configured capacitive reactive components $C_{adj}$, $C_2$ are in series. Based on Equation 1, by increasing the capacitance value of variable capacitor $C_{adj}$, the attenuation of the input RF pulse signal (i.e., $RF_1$) is also increased. Conversely, by decreasing the capacitance value of variable capacitor $C_{adj}$, the attenuation of the input RF pulse signal (i.e., $RF_1$) is accordingly reduced.

Referring to FIG. 6, the depicted output-stage network of reactive electrical components 600 may be used for networks 108a-108d of FIG. 1. The output-stage network of reactive electrical components 600 may be described by its equivalent circuit 602. As shown, the attenuated RF pulse signal $RF_2$ output from network 502 (FIG. 5) is (optionally) further attenuated (i.e., RF pulse signal $RF_3$) by the divider network of capacitors (i.e., reactive components) corresponding to output-stage network of reactive electrical components 600. In particular, the relationship between the inputted attenuated RF pulse signal $RF_2$ and the outputted further attenuated RF pulse signal $RF_3$ is given by:

$$RF_3 = RF_2 \left( \frac{C'_1}{C'_1 + C'_2 + C'_{adj}} \right) \qquad \text{Equation 2}$$

Whereby $C'_1$ is an input capacitive reactive component having an input terminal coupled to output terminal 'o' (FIG. 1) of a respective switch unit and an output terminal coupled to parallel capacitive reactive components $C'_{adj}$ and $C'_2$. Thus, the input capacitive reactive component $C'_1$ and the parallel configured capacitive reactive components $C'_{adj}$, $C'_2$ are in series. Based on Equation 2, by increasing the capacitance value of variable capacitor $C'_{adj}$, the attenuation of the attenuated input RF pulse signal (i.e., $RF_2$) is also increased. Conversely, by decreasing the capacitance value of variable capacitor $C'_{adj}$, the attenuation of the attenuated input RF pulse signal (i.e., $RF_2$) is accordingly reduced. As previously described, the circuits depicted in both FIGS. 5 and 6 may be identical, thus applying the same attenuation to the received RF pulse signals. Moreover, the circuits depicted in both FIGS. 5 and 6 are utilized in both the plurality of networks of reactive electrical components 104a-104d (FIG. 1) and the plurality of output-stage networks of reactive electrical components 108a-108d (FIG. 1), respectively.

Referring to FIG. 3, an exemplary controllable reactive component 302 used to implement a variable capacitor 304 is depicted. The exemplary controllable reactive component 302 represented by variable capacitor 304 may be used in both the plurality of networks of reactive electrical components 104a-104d (FIG. 1: $C_{adj}$) and the plurality of output-stage networks of reactive electrical components 108a-108d (FIG. 1; and FIG. 6: $C'_{adj}$), respectively. As depicted, the controllable reactive component 302 may include a parallel configuration of multiple capacitors $C_{adj1}$, $C_{adj2}$, $C_{adj3}$, and $C_{adj4}$. Each of the capacitors $C_{adj1}$, $C_{adj2}$, $C_{adj3}$, $C_{adj4}$ are connected to ground via respective switches $S_{adj1}$, $S_{adj2}$, $S_{adj3}$, and $S_{adj4}$. In particular, one terminal of each of the capacitors $C_{adj1}$, $C_{adj2}$, $C_{adj3}$, $C_{adj4}$ is coupled together, while the other terminal of each of the capacitors $C_{adj1}$, $C_{adj2}$, $C_{adj3}$, $C_{adj4}$ is connected in series to respective switches $S_{adj1}$, $S_{adj2}$, $S_{adj3}$, and $S_{adj4}$. In operation, by actuating the switches $S_{adj1}$, $S_{adj2}$, $S_{adj3}$, $S_{adj4}$ to a closed position, the capacitors $C_{adj1}$, $C_{adj2}$, $C_{adj3}$, $C_{adj4}$ are coupled to ground and remain part of the parallel configuration of capacitors. Alternatively, by actuating the switches $S_{adj1}$, $S_{adj2}$, $S_{adj3}$, $S_{adj4}$ to an open position, the capacitors $C_{adj1}$, $C_{adj2}$, $C_{adj3}$, $C_{adj4}$ are not coupled to ground and are thus removed from the parallel configuration of capacitors. For example, by actuating switches $S_{adj1}$ and $S_{adj4}$ to a closed position and switches $S_{adj2}$ and $S_{adj3}$ to an open position, capacitors $C_{adj1}$ and $C_{adj4}$ are coupled to ground and in a parallel configuration, while capacitors $C_{adj2}$ and $C_{adj2}$ are not within the parallel configuration. The total capacitance is thus the sum of capacitors $C_{adj1}$ and $C_{adj4}$. By varying the switch positions, different capacitance values can therefore be obtained for altering the attenuation factors within the networks of reactive electrical components 104a-104d and the plurality of output-stage networks of reactive electrical components 108a-108d. For example, in order to increase the total capacitance given by the sum of capacitors $C_{adj1}$ and $C_{adj4}$, switch $S_{adj3}$ may additionally be actuated to a closed position. The total capacitance is now the sum of capacitors $C_{adj1}$, $C_{adj3}$, and $C_{adj4}$. Thus, the controllable reactive component 302 provides an exemplary adjustable reactance within the plurality of networks of reactive electrical components 104a-104d (FIG. 1) and the plurality of output-stage networks of reactive electrical components 108a-108d (FIG. 1). Accordingly, varying this adjustable reactance in turn varies the attenuation provided by the plurality of networks of reactive electrical components 104a-104d (FIG. 1) and the plurality of output-stage networks of reactive electrical components 108a-108d (FIG. 1).

For illustrative brevity only four (4) parallel capacitors and switches are depicted in FIG. 3. However, it may be appreciated that any number of parallel capacitors may be utilized in order to establish the requisite resolution of attenuation factor variation exhibited by any one of the plurality of networks of reactive electrical components 104a-104d (FIG. 1) and the optionally provided plurality of output-stage networks of reactive electrical components 108a-108d (FIG. 1). The capacitors associated with the networks of reactive electrical components 104a-104d (FIG. 1) and the plurality of output-stage networks of reactive electrical components 108a-108d (FIG. 1) may have capacitance values in the range of 0.1-10 femtofarads (fFs). However, greater or lesser values may be contemplated.

Referring to FIG. 2, the switches $S_{adj1}$, $S_{adj2}$, $S_{adj3}$, $S_{adj4}$ (FIG. 3) used in the exemplary controllable reactive component 302 (FIG. 3) may be implemented by a transistor device. Thus, switch 202 may be implemented by FET device 204. More specifically, by applying a control voltage to the gate G of the FET device 204, a closed electrical circuit connection may be established between the drain D and the Source S of the device 204.

Referring to FIG. 4, each of the qubits 110a-110d shown in FIG. 1 may, for example, include a transmon 402. As depicted, the transmon 402 may be characterized as a resonant circuit 404 having a capacitance C and a non-linear inductance $L_j(\phi)$. Thus, when the transmon receives an RF pulse signal having a frequency that is substantially the same as (i.e., matches) its resonant frequency, the transmon may accordingly oscillate backwards and forwards between, for example, two (2) quantum mechanical eigenstates. The oscillation frequency backwards and forwards between these two states occurs at a lower frequency that is proportional to the amplitude of the RF pulse signal. Therefore, as previously described, by controlling the amplitude of the RF pulse signal that is applied to the transmon 402, a desired quantum mechanical eigenstate may be achieved at the end of each pulse period. The transmon 402 may include a Josephson junction formed by a metal-insulator-metal (MIM) layer of aluminum, aluminum oxide, and aluminum.

Referring back to FIG. 1, in operation, two or more of the substantially identical qubits 110a-110d may require a predefined change in their respective quantum mechanical eigenstates (e.g., a π/2 rotation). Referring to FIG. 7, a qubit's angular rotation is proportional to the product of the amplitude ($V_{rf}$) and pulse period ($T_{pulse}$) of the radio frequency (RF) pulse signal 700. Since the pulse period ($T_{pulse}$) of the radio frequency (RF) pulse signal 700 is the same for all of the substantially identical qubits 110a-110d (FIG. 1), adjustments to each individual qubit's 110a-110d (FIG. 1) angular rotation is accomplished by varying the amplitude ($V_{rf}$) of the radio frequency (RF) pulse signal 700 via the respective networks of reactive electrical components 104a-104b (FIG. 1). Referring back to FIG. 1, in particular, the respective networks of reactive electrical components 104a-104b provide such an adjustment by means of variable capacitor $C_{adj}$. Also, as previously described, in embodiments that further include output-stage network of reactive electrical components 108a-108d, the amplitude $V_{rf}$ (FIG. 7) of the radio frequency (RF) pulse signal 700 (FIG. 7) may be further adjusted using variable capacitors $C'_{adj}$ (FIG. 6).

For example, the radio frequency (RF) pulse signal 700 (FIG. 7) may be applied to qubits 110a and 110b by configuring respective switch units 106a and 106b accordingly. Since qubits 110a and 110b are substantially identical and receive the same radio frequency (RF) pulse signal 700 that is tapped off the transmission line 102, there may be an expectation that the qubits 110a, 110b underdo the same quantum mechanical rotation. This expectation may however be thwarted by a difference in reactive component tolerances between the network of reactive electrical components 104a corresponding to qubit 110a and the network of reactive electrical components 104b corresponding to qubit 110b. More specifically, although the capacitors (i.e., reactive components) within qubit 110a's network of reactive electrical components 104a are manufactured to be the same as qubit 110b's network of reactive electrical components 104b, the manufacturing process may cause slight variations in the capacitance values between the networks of reactive electrical components 104a, 104b. For instance, although capacitor $C_2$ within the qubit 110a's network of reactive electrical components 104a is manufactured to have the same capacitance as capacitor $C_2$ within qubit 110b's network of reactive electrical components 104b, due to manufacturing tolerances, the $C_2$ capacitor values in the networks of reactive electrical components 104a, 104b may slightly differ. This causes a slight difference in capacitive reactance value, which in turn contributes to differences in attenuation between network 104a and network 104b. Thus, for the same applied RF pulse signal 700 (FIG. 7), qubits 110a and 110b undergo different rotations as a result of the RF pulse signal 700 being attenuated by slightly different amounts before being applied to the qubits 110a, 110b. However, during calibration, each of the network of reactive electrical components 104a, 104b can be individually adjusted to compensate for such differences in attenuation resulting from reactive component tolerances. Thus, by making the appropriate adjustments, each of qubits 110a and 110b receive an attenuated RF pulse signal having the same amplitude, which subsequently causes both qubits to undergo the same predetermined rotation (e.g., a π/2 rotation). More particularly, the $C_{adj}$ capacitance values of the network of reactive electrical components 104a, 104b may be adjusted to compensate for such differences in attenuation resulting from the reactive component tolerances associated with the network of reactive electrical components 104a, 104b.

Figure 8:
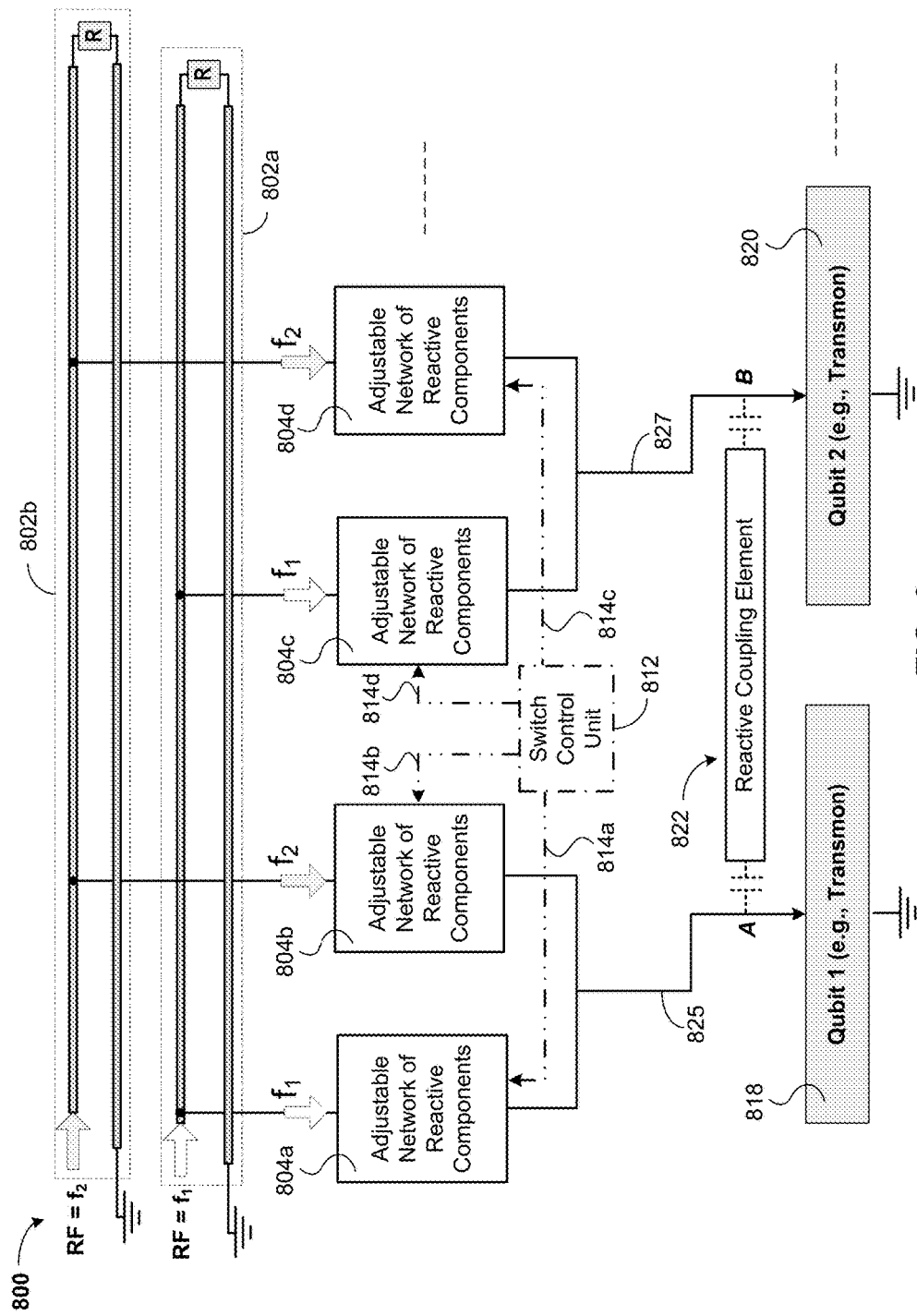
FIG. 8 shows a quantum mechanical computer radio frequency (RF) signaling system, according to another embodiment.

FIG. 8 shows a quantum mechanical computer radio frequency (RF) signaling system 800, according to another embodiment. In particular, the quantum mechanical computer radio frequency (RF) signaling system 800 enables quantum entanglement between reactively coupled qubits. As depicted, system 800 includes transmission lines 802a and 802b, a plurality of networks of reactive electrical components 804a-804d coupled to the transmission lines 802a, 802b, a switch control unit 812 having control outputs 814a-814d that are coupled to the plurality of networks of reactive electrical components 804a-804d, and a plurality of qubits 818-820 coupled to the plurality of networks of reactive electrical components 804a-804d. As further depicted, a reactive coupling element 822 may couple qubits 818 and 820. The reactive coupling element 822 may include a network of reactive components, a single capacitor between points A and B, or a transmission line capacitively coupled to links 825 and 827. Using reactive coupling element 822, a quantum entanglement condition between qubits 818 and 820 may be accomplished.

The switch control unit 812 includes respective control outputs 814a-814d that, among other things, control the actuation of switches within the plurality of networks of reactive electrical components 804a-804d. In particular, the plurality of networks of reactive electrical components 804a-804d may be identical to those utilized in FIG. 1. The actuation of such switches is depicted in FIG. 3, whereby under the control of a reactive network switch control unit 306, different capacitance values and attenuation factors can be set. Switch control unit 812 may be identical to reactive network switch control unit 306, and thus controls the capacitance values and attenuation factors for the plurality of networks of reactive electrical components 804a-804d. Although not depicted in FIG. 8, as with FIG. 1, a switch unit identical to or similar to switch unit 106a (FIG. 1) may be utilized between networks of reactive electrical components 804a and 804b, and qubit 818. Moreover, a switch unit identical to or similar to switch unit 106b (FIG. 1) may be utilized between networks of reactive electrical components 804c and 804d, and qubit 820. Thus, depending on the configuration of switches $R_1$ and $R_2$ within each of the switch units 106a, 106b (FIG. 1), qubits 818 and 820 undergo either a predefined change in the linear combination of at least two quantum mechanical eigenstates, or maintain their current quantum mechanical eigenstate. The control logic unit 812 may be implemented in hardware, firmware, software, or any combination thereof. For illustrative brevity only two (2) adjacent qubits 818-820 are depicted in FIG. 8. It may, however, be appreciated that any number of qubits (i.e., 1-N) can be coupled to the transmission lines 802a, 802b via corresponding networks of reactive electrical components.

In operation, radio frequency (RF) pulse signals $f_1$ and $f_2$ are applied to respective transmission lines 802a and 802b. The transmission lines 802a, 802b are each terminated by an impedance matching resistor R in order to mitigate RF signal reflections associated with the radio frequency (RF) pulse signals $f_1$, $f_2$ propagating along each of the transmission lines 802a, 802b. RF pulse signals $f_1$ and $f_2$ may be similar to the RF pulse signal illustrated in FIG. 7. For example, RF pulse signals $f_1$ may include a 5.00 Ghz RF signal that is generated over a 20 nanosecond (ns) pulse period ($T_{pulse}$) at 1 microsecond (μs) intervals ($T_{int}$). Also, RF pulse signals $f_2$ may include a 5.05 Ghz RF signal that is generated over a 20 nanosecond (ns) pulse period ($T_{pulse}$) at 1 microsecond (μs) intervals ($T_{int}$).

In the embodiment of FIG. 8, each of the qubits 818, 820 can be driven by one of two different RF pulse signals ($f_1$ or $f_2$) that are each attenuated by a network of reactive electrical components. Furthermore, adjacent qubits 818, 820 may be reactively coupled to each other via the reactive coupling element 822. Specifically, as depicted in FIG. 8, an RF pulse signal $f_1$ may be applied to, and propagate, along transmission line 802a. The RF pulse signal $f_1$ is then tapped off the transmission line 802a and attenuated by the network of reactive electrical components 804a, whereby the attenuated RF pulse signal $f_1$ is applied to Qubit 818. Another RF pulse signal $f_2$ may be applied to, and propagate, along transmission line 802b. The RF pulse signal $f_2$ is then tapped off the transmission line 802b and attenuated by the network of reactive electrical components 804b, whereby the attenuated RF pulse signal $f_2$ is also applied to Qubit 818. Thus, Qubit 818 may be driven either by an attenuated version of RF pulse signal $f_1$ or an attenuated version of RF pulse signal $f_2$.

Similarly, as further depicted in FIG. 8, RF pulse signal $f_1$ is also tapped off transmission line 802a and attenuated by the network of reactive electrical components 804c, whereby the attenuated RF pulse signal $f_1$ is applied to Qubit 820. RF pulse signal $f_2$ is also tapped off transmission line 802b and attenuated by the network of reactive electrical components 804d, whereby the attenuated RF pulse signal $f_2$ is also applied to Qubit 820. Thus, Qubit 820 may be driven either by an attenuated version of RF pulse signal $f_1$ or an attenuated version of RF pulse signal $f_2$.

As previously described in relation to FIG. 7, a qubit's angular rotation is proportional to the product of the amplitude ($V_{rf}$) and pulse period ($T_{pulse}$) of the radio frequency (RF) pulse signal 700. Since the pulse period ($T_{pulse}$) of the radio frequency (RF) pulse signal 700 is related to its frequency, which is set to the resonance frequency of the qubits 818, 820 (FIG. 8), adjustments to each individual qubit's 818, 820 (FIG. 8) angular rotation is accomplished by varying the amplitude ($V_{rf}$) of the radio frequency (RF) pulse signals $f_1$, $f_2$ via the respective networks of reactive electrical components 804a-804b (FIG. 8).

Referring back to FIG. 8, since the networks of reactive electrical components 804a-804d each have an identical electrical configuration to the network depicted in FIG. 5, the networks of reactive electrical components 804a-804d accordingly provide such an adjustment by means of variable capacitor $C_{adj}$. Thus, for each of the networks of reactive electrical components 804a-804d, increasing the capacitance of the variable capacitor $C_{adj}$ increases the attenuation, while decreasing the capacitance of the variable capacitor $C_{adj}$ decreases the attenuation provided the network.

The embodiment of FIG. 8 may operate in two modes, whereby the quantum mechanical rotation of each qubit 818, 820 is either controlled separately (mode 1) or undergoes quantum mechanical entanglement with the other qubit (mode 2). In mode 1, for example, qubit 818 may receive RF pulse signal $f_1$ (e.g., 5.00 Ghz), which is attenuated by the network of reactive electrical components 804a. Since the frequency of RF pulse signal $f_1$ substantially matches the resonance frequency of qubit 818, the qubit 818 undergoes a predefined change (e.g., π/2) in the linear combination of at least two quantum mechanical eigenstates. However, since qubit 820 has a resonant frequency that substantially matches the frequency of RF pulse signal $f_2$ (e.g., 5.05 Ghz), based upon receiving attenuated RF pulse signal $f_1$ from network 804c, the quantum mechanical eigenstate of qubit 820 may remain substantially unchanged. Also in mode 1, for example, qubit 820 may receive RF pulse signal $f_2$ that is attenuated by network of reactive electrical components 804d. Since the frequency of RF pulse signal $f_2$ substantially matches the resonance frequency of qubit 820, the qubit 820 undergoes a predefined change (e.g., π/2) in the linear combination of at least two quantum mechanical eigenstates. However, since qubit 818 has a resonant frequency that substantially matches the frequency of RF pulse signal $f_1$, based upon receiving attenuated RF pulse signal $f_2$ from network 804b, the quantum mechanical eigenstate of qubit 818 may remain unchanged. Thus, by applying RF pulse signal $f_1$ (e.g., 5.00 Ghz) to qubit 818 and applying RF pulse signal $f_2$ (e.g., 5.05 Ghz) to qubit 820, each qubit's 818, 820 eigenstate is individually controlled via a RF pulse signal that matches their individual resonant frequency.

In mode 2, for example, qubit 818 receives RF pulse signal $f_2$ that is attenuated by network of reactive electrical components 804b. Qubit 820 also receives RF pulse signal $f_2$ that is attenuated by network of reactive electrical components 804d. Although received RF pulse signal $f_2$ matches the resonant frequency of qubit 820 and does not substantially match the resonance frequency of qubit 818, if the amplitude of RF pulse signal $f_2$ is sufficient, some quantum entanglement occurs between qubits 818 and 820 via the reactive coupling element 822. In particular, the quantum mechanical eigenstate change experienced by qubit 820 depends on the quantum mechanical eigenstate of qubit 818. Thus, the qubits 818, 820 are entangled.

The quantum mechanical computer radio frequency (RF) signaling system 800 may be maintained at cryogenic temperatures below one hundred (100) millikelvins (mK) in order to maintain the signaling system 800 at superconducting temperatures. For example, the quantum mechanical computer radio frequency (RF) signaling system 800 may be cooled in a cryostat to a temperature of about 30 mK.

Figure 9:
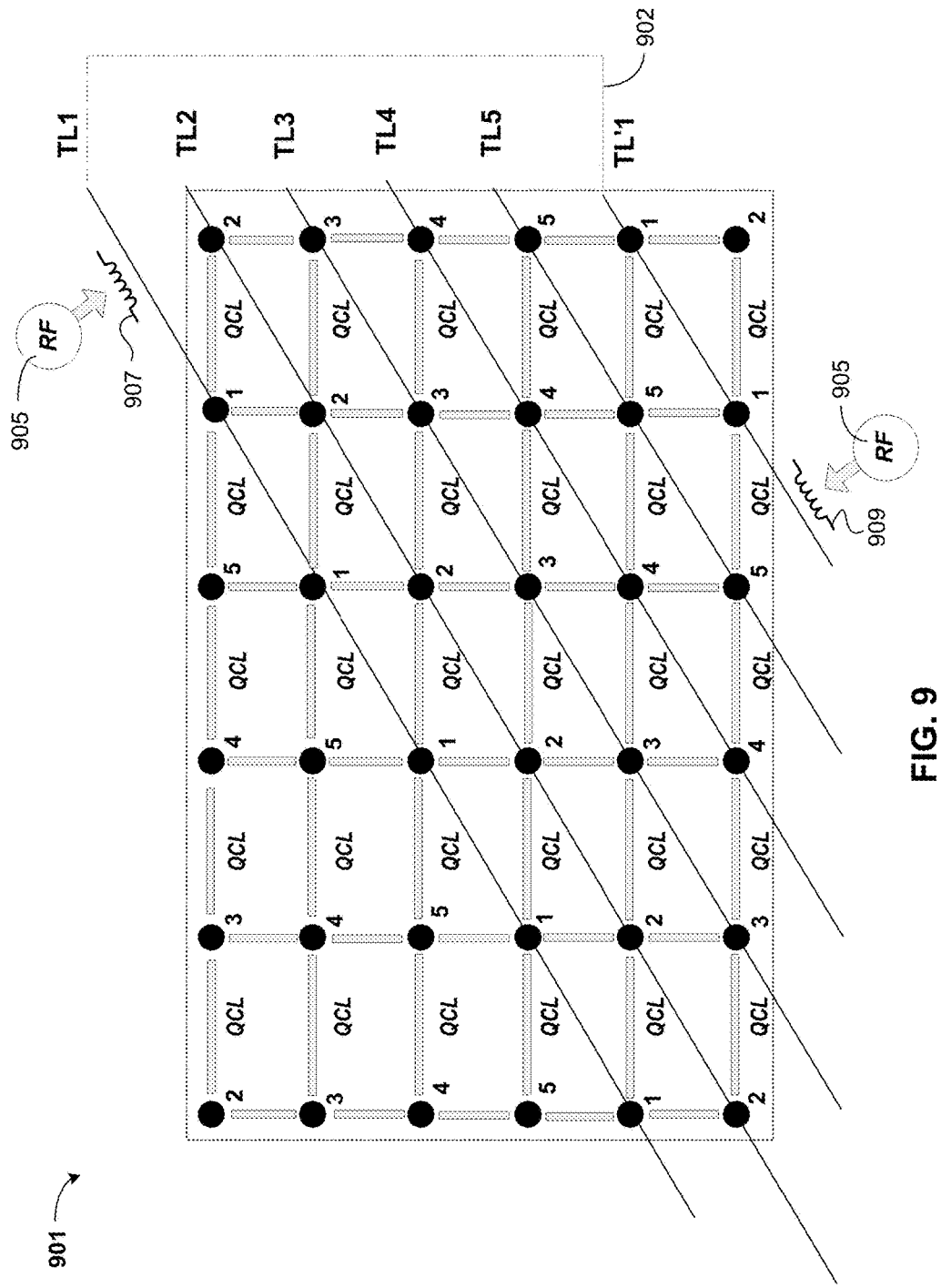
FIG. 9 shows an exemplary two-dimensional array of qubits receiving RF pulse signals, according to one embodiment.

FIG. 9 shows an exemplary two-dimensional array of qubits 901 receiving RF pulse signals, according to one embodiment. Each of the dark circles denoted by numbers 1-5 represent a qubit. As depicted, each of the qubits are weakly coupled (i.e., reactively) by quantum communication (QC) links QCL. The QC links QCL may include superconductive electrical links formed from, for example, Aluminum (Al) or Niobium (Nb), whereby each QC link QCL may be reactively coupled (e.g., capacitively) to a qubit at each end. The QC links QCL provide a means for enabling quantum entanglement conditions between the qubits in the array. As shown, qubits 1 are coupled to transmission line TL1 and are driven at a frequency F1, qubits 2 are coupled to transmission line TL2 and are driven at a frequency F2, qubits 3 are coupled to transmission line TL3 and are driven at a frequency F3, qubits 4 are coupled to transmission line TL4 and are driven at a frequency F4, qubits 5 are coupled to transmission line TL5 and are driven at a frequency F5, and qubits 1 are coupled to transmission line TL'1 and are also driven at frequency F1. In a serpentine connection approach, transmission lines that carry the same frequency to the qubits may be connected together. For example, transmission lines TL1 and TL'1 are both driven at the same frequency F1, and are thus connected together, as indicated by dashed line 902. Although for illustrative brevity, only transmission lines TL1 and TL'1 are shown, additional transmission lines coupled to other qubits 1 in the array 901 would also follow a serpentine pattern of connections. The same rationale may be applied to transmission lines TL2-TL5.

Alternatively, connections such as 902 may be omitted in favor of, for example, inductively coupling a frequency source to transmission lines being driven by the same frequency pulse signal. For example, transmission lines TL1 and TL'1 are both driven at the same frequency F1. Therefore, the RF output signal from a single RF source (i.e., signal generator) 905 may be inductively coupled to each of the transmission lines TL1, TL'1 that are driven at the same frequency F1. In particular, inductive coupling device 907 couples the RF output signal from RF source 905 to transmission lines TL1, while inductive coupling device 909 couples the RF output signal from RF source 905 to transmission lines TL'1. The same rationale may be applied to transmission lines TL2-TL5. The qubits 1-5 depicted in array 901 may include the same or similar circuitry for receiving an attenuated RF pulse signal as those corresponding to system 100 of FIG. 1.

The above array 901 of qubits 1-5 may be utilized to form, among other things, a surface code method of error prevention/correction using a discrete number of frequencies, pulse shapes, and phases. For example, one approach may contemplate using five (5) different qubit frequencies (i.e., F1-F5), and six (6) or more different pulses (e.g., pulse period, pulse interval, etc.) associated with each frequency. It may be appreciated that the depicted 2D mesh is exemplary. Thus, different lattices with different interconnections of the qubits and a different numbers of frequencies can be utilized.

The two-dimensional array of qubits 900 may be maintained at cryogenic temperatures below one hundred (100) millikelvins (mK) in order to maintain the array 900 at superconducting temperatures. For example, the two-dimensional array of qubits 900 may be cooled in a cryostat to a temperature of about 30 mK.

Although the exemplary embodiments described in the foregoing include networks of reactive components having capacitor devices, other reactive components such as inductors may also be utilized in order to provide a divider network capable of attenuating the received RF pulse signals in a controlled manner.

Figure 10:
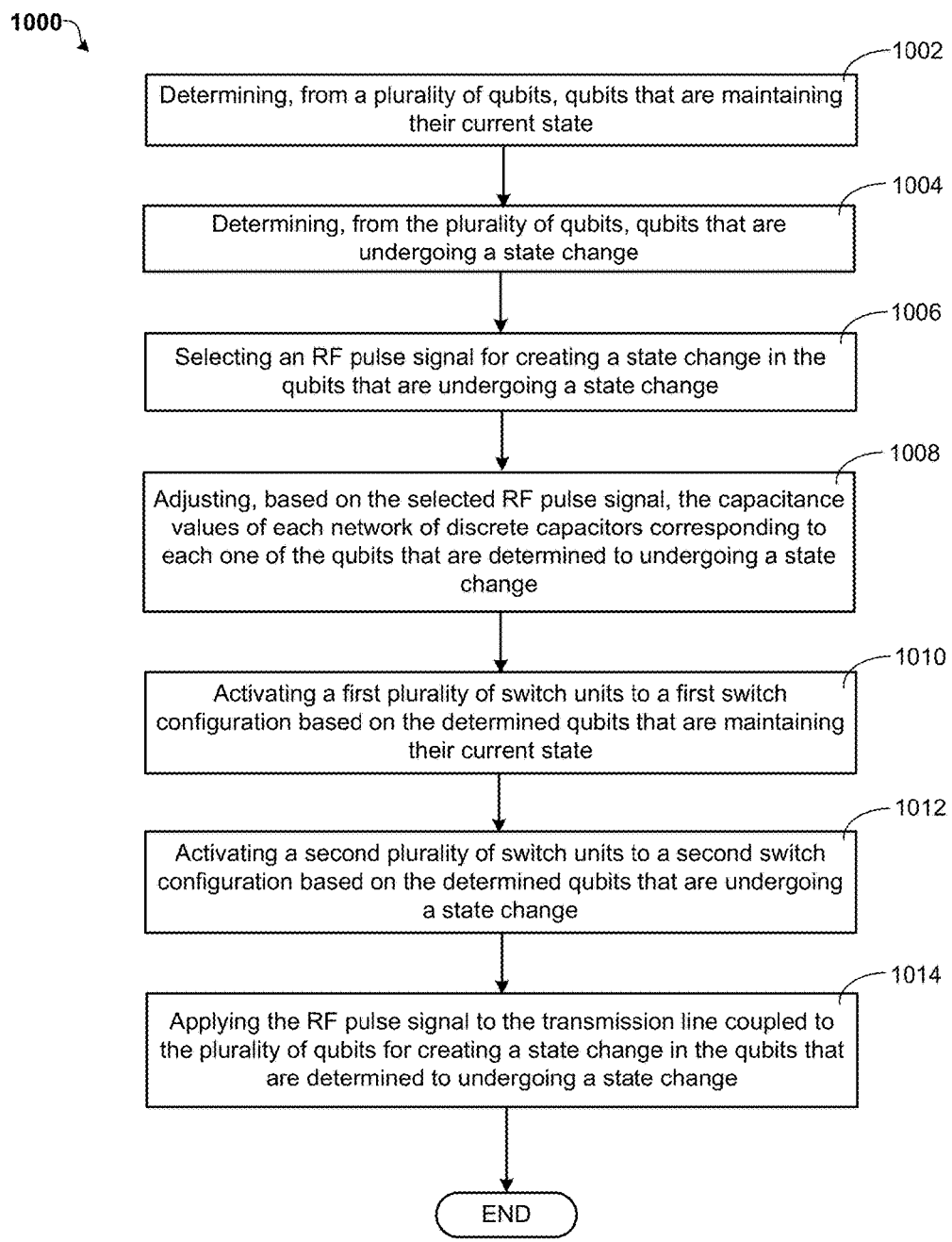
FIG. 10 shows an embodiment of a process flow (i.e., a Quantum Computing Signal Generation (QCSG) Program) for controlling the operating of the exemplary quantum mechanical computer radio frequency (RF) signaling system depicted in FIG. 1.

FIG. 10 shows an embodiment of a process flow (i.e., a Quantum Computing Signal Generation (QCSG) Program) 1000 for controlling the operating of the exemplary quantum mechanical computer radio frequency (RF) signaling system depicted in FIG. 1. The QCSG Program 1000 is described with the aid of FIG. 1. For example, the QCSG Program 1000 may be implemented within control logic unit 112 (FIG. 1).

At 1002, the one or more qubits that are maintaining their current state are determined. At 1004, however, one or more qubits that are to undergo a predefined quantum mechanical eigenstate change are identified. For example, it may be determined that from among the plurality of qubit 110a-110d (FIG. 1), qubits 110a and 110d will maintain their current quantum mechanical eigenstate (1002), while qubits 110b and 110c will undergo a predefined quantum mechanical eigenstate change (1004).

At 1006, an RF pulse is selected that is capable of creating the desired predefined quantum mechanical eigenstate change within the one or more qubits that are to undergo a predefined quantum mechanical eigenstate change. For example, RF pulse signal 700 (FIG. 7) may be selected to create a predefined π/2 quantum mechanical eigenstate change within both qubits 110b (FIG. 1) and 110c (FIG. 1). Accordingly, the frequency of the pulse signal 700 (FIG. 7) is selected to substantially match the resonant frequency of the qubits 110b, 110c. Moreover, the pulse period $T_{pulse}$, pulse interval time $T_{int}$, and the amplitude $V_{rf}$ of the RF pulse signal 700 are set to facilitate the creation of a π/2 quantum mechanical eigenstate change within both qubits 110b (FIG. 1) and 110c (FIG. 1).

Once the RF pulse is selected (1006), at 1008 the capacitance values of each network of reactive components corresponding to the one or more qubits that are to undergo a predefined quantum mechanical eigenstate change are adjusted. More specifically, the capacitance values are adjusted in order to establish a desired attenuation factor exhibited by the network of reactive components. As previously described, based on the attenuation of the RF pulse signal 700 (FIG. 7) by the networks of reactive components 104a-104d (FIG. 1) and the pulse period $T_{pulse}$ (FIG. 7) of the RF pulse signal 700, a predefined quantum mechanical eigenstate change within the one or more qubits that are to undergo a predefined quantum mechanical eigenstate change is established.

For example, it may be established (e.g., during calibration processes) that by setting the networks of reactive components 104b, 104c (FIG. 1) to provide a particular attenuation factor (e.g., '10'), the RF pulse signal 700 (FIG. 7) accordingly creates the predefined quantum mechanical eigenstate change (e.g., π/2) within selected qubits 110b and 110c (FIG. 1). More particularly, the networks of reactive components 104b, 104c provide the particular attenuation factor (e.g., '10') by adjusting $C_{adj}$ (FIG. 1) within each of the networks 104b, 104c. As depicted in FIG. 3, the capacitance value of $C_{adj}$ may be varied or adjusted by setting switches $S_{adj1}$, $S_{adj2}$, $S_{adj3}$, and $S_{adj4}$ via reactive network switch control 306. The operation of the reactive network switch control 306 may be carried out within the control logic unit 112 (FIG. 1). Thus, in the given example, the control logic unit 112 would set the networks of reactive components 104b, 104c to apply an attenuation factor of around '10' to the received RF pulse signal 700. However, as previously described in the foregoing, each of the networks of reactive components 104b, 104c may be adjusted differently to compensate for reactive component tolerances attributing to slightly different reactive component values (e.g., capacitance) in each network 104b, 104c. Without such individual adjustment, for example, network of reactive components 104b may apply an attenuation factor of '10.1', while network of reactive components 104c may apply an attenuation factor of '9.7'. Thus, for a set frequency and pulse period $T_{pulse}$ of the RF pulse signal 700, the unmatched attenuation factors of the networks 104b, 104c can in turn cause different quantum mechanical eigenstate changes in qubits 110b and 110c.

At 1010, a first plurality of switch units are activated to a first switch configuration for the qubits that have been determined as maintaining their current quantum mechanical eigenstate. For example, the control logic unit 112 (FIG. 1) actuates the switches of switch units 106a (FIG. 1) and 106d (FIG. 1) in order to electrically isolate the RF pulse signal 700 (FIG. 7) from respective qubits 110a (FIG. 1) and 110d (FIG. 1), thus avoiding the creation of a state change in these qubits 110a, 110d. More specifically, within switch unit 106a, the control logic unit 112 configures switch $R_1$ to an open position and switch $R_2$ to a closed position. Switch $R_2$, by establishing an electrical path to ground, mitigates leakage current across open switch $R_1$ from changing the current quantum mechanical eigenstate of qubit 110a. Similarly, within switch unit 106d, the control logic unit 112 configures switch $R_1$ to an open position and switch $R_2$ to a closed position. Switch $R_2$, by establishing an electrical path to ground, also mitigates leakage current across open switch $R_1$ from changing the current quantum mechanical eigenstate of qubit 110d.

At 1012, a second plurality of switch units are activated to a second switch configuration for the qubits that are to undergo a predefined quantum mechanical eigenstate change (e.g., $\pi/2$). For example, the control logic unit 112 (FIG. 1) actuates the switches of switch units 106b (FIG. 1) and 106c (FIG. 1) in order to electrically provide an electrical path for applying the RF pulse signal 700 (FIG. 7) to respective qubits 110b (FIG. 1) and 110c (FIG. 1), thus creating a predefined state change (e.g., $\pi/2$) in these qubits 110b, 110c. More specifically, within switch unit 106b, the control logic unit 112 configures switch $R_1$ to a closed position and switch $R_2$ to an open position. Switch $R_1$ of unit 106b thus establishes an electrical path for applying the RF pulse signal 700 to qubit 110b. Similarly, within switch unit 106c, the control logic unit 112 configures switch $R_1$ to a closed position and switch $R_2$ to an open position. Switch $R_1$ of unit 106c thus establishes an electrical path for applying the RF pulse signal 700 to qubit 110c.

At 1014, the selected RF pulse is applied to the transmission line coupled to the plurality of qubits for creating the quantum mechanical eigenstate change in the qubits that are to undergo a state change. For example, based on the configuration of the switches (1010, 1012), the RF pulse signal 700 (FIG. 7) is attenuated and applied to qubits 110b (FIG. 1) and 110c (FIG. 1). More specifically, the RF pulse signal 700 (FIG. 7) is transmitted over the transmission line 102 (FIG. 1) and received by qubit 110b via network of reactive components 104b (FIG. 1), switch $R_1$ of switch unit 106b (FIG. 1), and the output-stage network of reactive electrical components 108b (FIG. 1). Similarly, the RF pulse signal 700 that is transmitted over the transmission line 102 is also received by qubit 110b via network of reactive components 104c (FIG. 1), switch $R_1$ of switch unit 106c (FIG. 1), and the output-stage network of reactive electrical components 108c (FIG. 1). Thus, upon receiving the RF pulse signal 700 that is attenuated, qubits 110b and 110c both undergo the predefined quantum mechanical eigenstate change (e.g., $\pi/2$).

The foregoing describes, among other things, networks of reactive components (e.g., discrete capacitor divider networks) that provide individual attenuation tuning for each qubit that is driven by a common RF pulse signal from a single transmission line, thus alleviating the use of multiple transmission lines and RF pulse sources within a cryogenically controlled quantum computing environment.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 11:
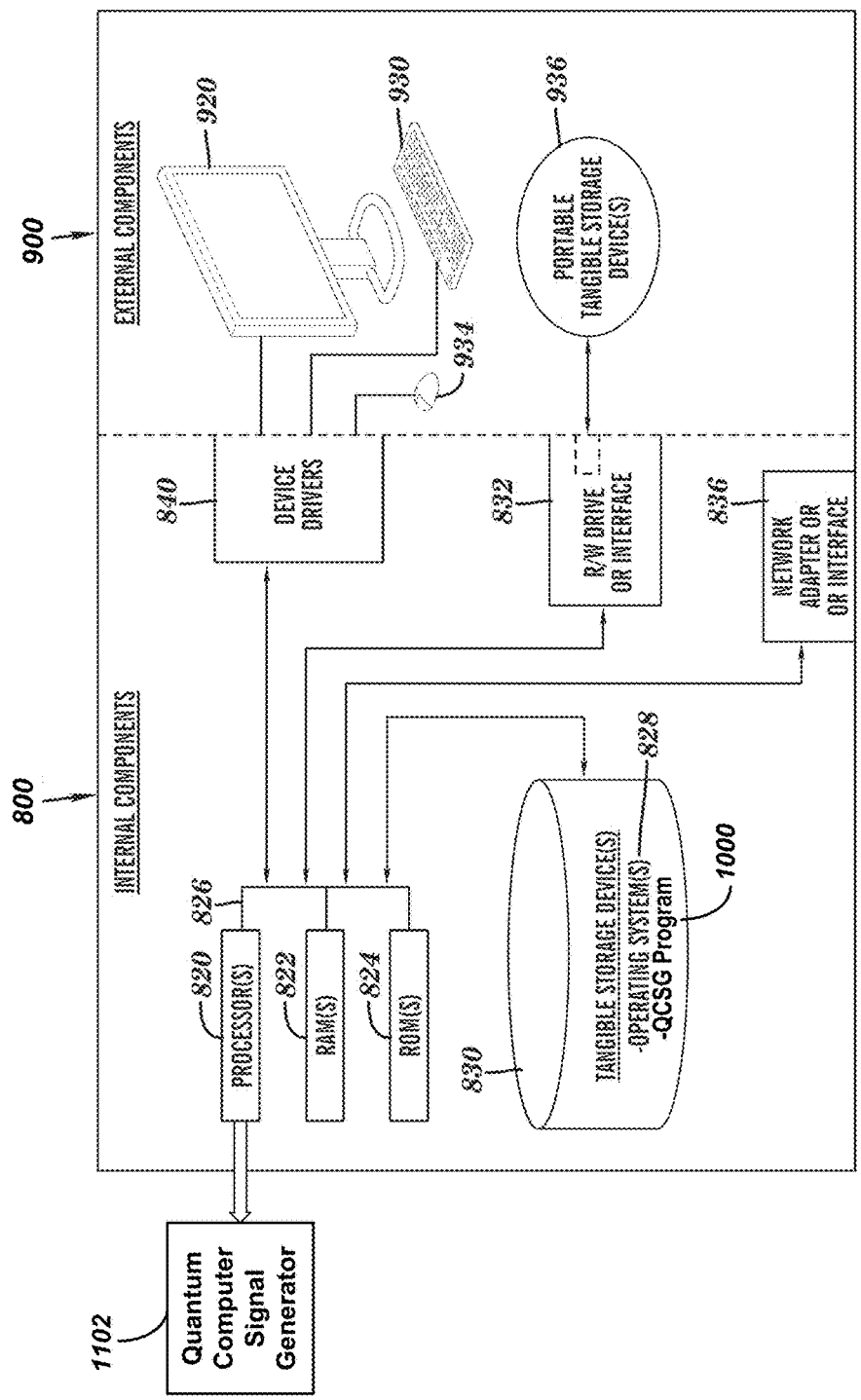
FIG. 11 is a block diagram of hardware and software for executing the process flows of FIG. 10 according to one embodiment.

FIG. 11 shows a block diagram of the components of a data processing system 800, 900, that may be incorporated within control logic unit 112 (FIG. 1) in accordance with an illustrative embodiment of the present invention. It should be appreciated that FIG. 11 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may be represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The data processing system 800, 900 may include a set of internal components 800 and a set of external components 900 illustrated in FIG. 11. The set of internal components 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs such as Quantum Computing Signal Generation (QCSG) Program 1000 is stored on one or more computer-readable tangible storage devices 830 for execution by one or more processors 820 via one or more RAMs 822 (which typically include cache memory). In the embodiment illustrated in FIG. 11, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

The set of internal components 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. The QCSG program 1000 can be stored on one or more of the respective portable computer-readable tangible storage devices 936, read via the respective R/W drive or interface 832 and loaded into the respective hard drive 830.

The set of internal components 800 may also include network adapters (or switch port cards) or interfaces 836 such as a TCP/IP adapter cards, wireless wi-fi interface cards, or 3G or 4G wireless interface cards or other wired or wireless communication links. QCSG program 1000 can be downloaded from an external computer (e.g., server) via a network (for example, the Internet, a local area network or other, wide area network) and respective network adapters or interfaces 836. From the network adapters (or switch port adaptors) or interfaces 836, the QCSG program 1000 is loaded into the respective hard drive 830. The network may comprise copper wires, optical fibers, wireless transmission, routers, firewalls, switches, gateway computers and/or edge servers.

The set of external components 900 can include a computer display monitor 920, a keyboard 930, and a computer mouse 934. External component 900 can also include touch screens, virtual keyboards, touch pads, pointing devices, and other human interface devices. The set of internal components 800 also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

As further depicted in FIG. 11, by executing the QCSG program 1000, a quantum computer signal generator 1102 may be controlled, via the one or more processors 820, to generate a desired RF pulse signal for activating a state change in the qubits 110a-110d of FIG. 1.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A quantum mechanical radio frequency (RF) signaling system comprising:
a transmission line that receives and conducts an RF pulse signal operating at a radio frequency;
a first qubit having a quantum mechanical state that is a linear combination of at least two quantum mechanical eigenstates;
a first network of reactive electrical components having an input coupled to the transmission line for receiving the RF pulse signal and an output coupled to the first qubit, wherein the first network of reactive electrical components attenuates the amplitude of the RF pulse signal and produces a first attenuated RF pulse signal that is applied to the first qubit, the first attenuated RF pulse signal operating at the radio frequency and having a first attenuated amplitude that cause a predefined change in the linear combination of at least two quantum mechanical eigenstates within the first qubit, wherein the first network of reactive electrical components include an adjustable reactance for varying an attenuation associated with the first attenuated amplitude;
a second qubit substantially identical to the first qubit, the second qubit having a quantum mechanical state that is a linear combination of at least two quantum mechanical eigenstates; and
a second network of reactive electrical components having an input coupled to the transmission line for receiving the RF pulse signal and an output coupled to the second qubit, wherein the second network of reactive electrical components attenuates the amplitude of the RF pulse signal and produces a second attenuated RF pulse signal that is applied to the second qubit, the second attenuated RF pulse signal operating at the radio frequency and having a second attenuated amplitude that cause the predefined change in the linear combination of at least two quantum mechanical eigenstates within the second qubit,
wherein the first attenuated amplitude and the second attenuated amplitude compensate for differences in reactive component tolerances between the first network of reactive electrical components and the second network of reactive electrical components.

2. The system of claim 1, wherein the first qubit is coupled through a reactive electrical network to the second qubit.

3. The system of claim 1, wherein the first network of reactive electrical components comprises a first controllable reactive component to attenuate, in a controlled manner, the amplitude of the first attenuated RF pulse signal.

4. The system of claim 3, wherein the ratio of the RF pulse signal to the first attenuated RF pulse signal is approximately 10-100.

5. The system of claim 3, wherein the first network of reactive electrical components comprise:
a first input reactive component coupled to and in series with the first controllable reactive component, the first input reactive component having a first terminal that is coupled to the transmission line for receiving the RF pulse signal and a second terminal that is coupled to the first controllable reactive component.

6. The system of claim 5,
wherein the first controllable reactive component comprises a first plurality of parallel capacitor devices each having a switch connected in series, the first plurality of parallel capacitor devices having a terminal coupled to the second terminal of the first input reactive component and a terminal coupled to ground, and
wherein upon actuation of the switch to a closed position, a corresponding capacitor device associated with the first plurality of parallel capacitor devices that is in series with the switch remains within the first plurality of parallel capacitor devices, and
wherein upon actuation of the switch to an open position, the corresponding capacitor device associated with the first plurality of parallel capacitor devices that is in series with the switch is removed from the first plurality of parallel capacitor devices.

7. The system of claim 1, wherein the second network of reactive electrical components comprises a second controllable reactive component to attenuate, in a controlled manner, the amplitude of the second attenuated RF pulse signal.

8. The system of claim 7, wherein the ratio of the RF pulse signal to the second attenuated pulse RF signal is approximately 10-100.

9. The system of claim 7, wherein the second network of reactive electrical components comprise:
a second input reactive component coupled to and in series with the second controllable reactive component, the second input reactive component having a first terminal that is coupled to the transmission line for receiving the RF pulse signal and a second terminal that is coupled to the second controllable reactive component.

10. The system of claim 9,
wherein the second controllable reactive component comprises a second plurality of parallel capacitor devices each having a switch connected in series, the second plurality of parallel capacitor devices having a terminal coupled to the second terminal of the second input reactive component and a terminal coupled to ground, and
wherein upon actuation of the switch to a closed position, a corresponding capacitor device associated with the second plurality of parallel capacitor devices that is in series with the switch remains within the second plurality of parallel capacitor devices, and
wherein upon actuation of the switch to an open position, the corresponding capacitor device associated with the second plurality of parallel capacitor devices is removed from the second plurality of parallel capacitor devices.

11. The system of claim 1, wherein the RF pulse signal comprises pulse periods of approximately 10-500 nanoseconds, and wherein the operating frequency within each of the pulse periods comprises a frequency of about approximately 1-10GHz.

12. The system of claim 1, further comprising:
a first switch unit having an input and an output, wherein the input of the first switch unit is coupled to the first network of reactive electrical components; and
a first output-stage network of reactive electrical components having an input and an output, wherein the input of the first output-stage network of reactive electrical components is coupled to the output of the first switch unit, and wherein the output of the first output-stage network of reactive electrical components is coupled to the first qubit.

13. The system of claim 12, wherein the first switch unit comprises a first switch device that controls an electrical connection for coupling the first attenuated RF pulse signal received from the first network of reactive electrical components to the first output-stage network of reactive electrical components, and wherein upon actuation of the first switch device to a closed position, the first attenuated RF pulse signal is further attenuated by the first output-stage network of reactive electrical components and causes the predefined change in the linear combination of at least two quantum mechanical eigenstates within the first qubit based on the applied radio frequency, and wherein upon actuation of the first switch device to an open position the first qubit remains in a previous established linear combination of at least two quantum mechanical eigenstates within the first qubit.

14. The system of claim 1, wherein the first qubit comprises a first transmon and the second qubit comprises a second transmon.

15. The system of claim 1, further comprising:
a second switch unit having an input and an output, wherein the input of the second switch unit is coupled to the second network of discrete reactive electrical components; and
a second output-stage network of reactive electrical components having an input and an output, wherein the input of the second output-stage network of reactive electrical components is coupled to the output of the second switch unit and the output of the second output-stage network of reactive electrical components is coupled to the second qubit.

16. The system of claim 15, wherein the second switch unit comprises a second switch device that controls an electrical connection for coupling the second attenuated RF pulse signal received from the second network of reactive electrical components to the second output-stage network of reactive electrical components, and wherein upon actuation of the second switch device to a closed position the second attenuated RF pulse signal is further attenuated by the second output-stage network of reactive electrical components and causes the predefined change in the linear combination of at least two quantum mechanical eigenstates within the second qubit based on the applied radio frequency, and wherein upon actuation of the second switch device to an open position the second qubit remains in a previous established linear combination of at least two quantum mechanical eigenstates within the second qubit.

17. A computer system for providing radio frequency (RF) signaling over a transmission line to a plurality of qubits coupled to the transmission line in a quantum mechanical computer system, the computer system comprising:
one or more processors, one or more computer-readable memories, one or more computer-readable tangible storage devices, and program instructions stored on at least one of the one or more storage devices for execution by at least one of the one or more processors via at least one of the one or more memories, wherein the computer system is programed to:
apply an RF pulse signal operating at a radio frequency to the transmission line;
attenuate, using a first network of reactive electrical components, the amplitude of the applied RF pulse signal received from the transmission line to generate a first attenuated RF pulse signal operating at the radio frequency and having a first attenuated amplitude;
attenuate, using a second network of reactive electrical components, the amplitude of the applied RF pulse signal received from the transmission line to generate a second attenuated RF pulse signal operating at the radio frequency and having a second attenuated amplitude;
apply the first attenuated RF pulse signal to the first qubit and causing, based on the first attenuated amplitude, a predefined change in a linear combination of at least two quantum mechanical eigenstates within the first qubit, and
apply the second attenuated RF pulse signal to the second qubit and causing, based on the second attenuated amplitude, the predefined change in the linear combination of at least two quantum mechanical eigenstates within the second qubit,
wherein the first attenuated signal and the second attenuated signal compensate for differences in reactive component tolerances between the first network of reactive electrical components and the second network of reactive electrical components.

18. The computer system of claim 17, wherein the applying of the first attenuated RF pulse signal and causing the predefined change in the linear combination of at least two quantum mechanical eigenstates within the first qubit comprises closing a first switch located in a path between the first network of discrete reactive electrical components and the first qubit, and
wherein the applying of the second attenuated RF pulse signal and causing the predefined change in the linear combination of at least two quantum mechanical eigenstates within the second qubit comprises closing a second switch located in a path between the second network of discrete reactive electrical components and the second qubit.

19. A quantum mechanical radio frequency (RF) signaling system comprising:
a first qubit having a first input;
a second qubit having a second input;
a reactive element coupled between the first input of the first qubit and the second input of the second qubit;
a first transmission line that receives and conducts a first RF pulse signal having a first radio frequency;
a second transmission line that receives and conducts a second RF pulse signal having a second radio frequency;
a first network of reactive electrical components having an input coupled to the first transmission line for receiving the first RF pulse signal and an output coupled to the first qubit, wherein the first network of reactive electrical components attenuates the amplitude of the first RF pulse signal and produces a first attenuated RF pulse signal that is applied to the first qubit, the first attenuated RF pulse signal operating at the first radio frequency and having a first attenuated amplitude that causes a predefined change in a linear combination of at least two quantum mechanical eigenstates within the first qubit; and
a second network of reactive electrical components having an input coupled to the second transmission line for receiving the second RF pulse signal and an output coupled to the first qubit, wherein the second network of reactive electrical components attenuates the amplitude of the second RF pulse signal and produces a second attenuated RF pulse signal that is applied to the first qubit and coupled to the second qubit via the coupling element, the second attenuated RF pulse signal operating at the second radio frequency and having a second attenuated amplitude that causes a quantum mechanical entanglement between the first qubit and the second qubit.

* * * * *